(12) United States Patent
Kurihara et al.

(10) Patent No.: US 6,466,714 B1
(45) Date of Patent: Oct. 15, 2002

(54) METHOD OF PRODUCING PHASE MASK FOR FABRICATING OPTICAL FIBER AND OPTICAL FIBER WITH BRAGG'S DIFFRACTION GRATING PRODUCED BY USING THE PHASE MASK

(75) Inventors: Masaaki Kurihara, Tokyo (JP); Toshikazu Segawa, Tokyo (JP); Tetsuro Komukai, Tokyo (JP); Masataka Nakazawa, Tokyo (JP)

(73) Assignee: Dai Nippon Printing Co., Ltd. and Nippon Telegraph and Telephone Corporation, Tokyo (JP)

( * ) Notice: Subject to any disclaimer, the term of this patent is extended or adjusted under 35 U.S.C. 154(b) by 0 days.

(21) Appl. No.: 09/284,613

(22) PCT Filed: Sep. 2, 1998

(86) PCT No.: PCT/JP98/03924

§ 371 (c)(1),
(2), (4) Date: Apr. 27, 1999

(87) PCT Pub. No.: WO99/12075

PCT Pub. Date: Nov. 3, 1999

(30) Foreign Application Priority Data

Sep. 3, 1997 (JP) .............................................. 9-238438

(51) Int. Cl.[7] .............................. G02B 6/34; G03F 9/00
(52) U.S. Cl. .............................. 385/37; 359/566; 430/5
(58) Field of Search ........................... 385/37; 359/566; 438/32; 430/5

(56) References Cited

U.S. PATENT DOCUMENTS 3,732,363 A * 5/1973 Glenn, Jr. .................... 359/566
5,030,836 A   7/1991 Kusui et al.
5,367,588 A * 11/1994 Hill et al. ....................... 385/37
5,413,884 A *  5/1995 Koch et al. ...................... 430/5

FOREIGN PATENT DOCUMENTS

| EP | 0 602 829 | 6/1994 | |
| EP | 0 684 491 | 11/1995 | |
| GB | 2316497 | * 2/1998 | .................. 359/566 |
| JP | 8-286053 | 11/1996 | |
| JP | 8-286055 | 11/1996 | |
| JP | 9-243848 | 9/1997 | |

OTHER PUBLICATIONS

D. M. Tennant et al., "Characterization of near–field holography grating masks for optoelectronics fabricated by electron beam lithography", Journal of Vacuum Science and Technology: Part B, vol. 10, No. 6, pp. 2530–2535, Nov. 1, 1992.

* cited by examiner

*Primary Examiner*—Jon Henry
(74) *Attorney, Agent, or Firm*—Dellett & Walters

(57) ABSTRACT

The invention relates to a method of fabricating an optical fiber-processing phase mask in which a stitching error ascribable to a deterioration in the wavelength selectivity of the optical fiber diffraction grating to be fabricated is reduced. At an exposure step, a writing stage 5 with a phase mask blank 10 placed thereon is continuously fed in one direction while portions of the phase mask blank corresponding to grooves 26 or strips 27 in a direction perpendicular to the direction of feeding are sequentially scanned with writing beams 14, whereby the entire area of the phase mask blank 10 to be written is continuously written.

10 Claims, 8 Drawing Sheets

METHOD OF PRODUCING PHASE MASK FOR FABRICATING OPTICAL FIBER AND OPTICAL FIBER WITH BRAGG'S DIFFRACTION GRATING PRODUCED BY USING THE PHASE MASK

TECHNICAL ART

The present invention relates to a method of fabricating a phase mask for processing optical fibers, and an optical fiber with a Bragg diffraction grating, which is manufactured using the optical fiber-processing phase mask. More particularly, the present invention relates to a method of fabricating a phase mask for making a diffraction grating in an optical fiber used for optical communications, etc. using ultraviolet laser light, and an optical fiber with a Bragg diffraction grating, which is manufactured using the mask.

BACKGROUND ART

Optical fibers have brought about breakthroughs in the globalization of communications to make high-quality and large-capacity inter-oceanic telecommunications feasible. So far, it has been known that a Bragg diffraction grating is provided in an optical fiber by creating a periodic refractive index profile in an optical fiber core along the optical fiber, and the magnitude of reflectivity and the width of the wavelength characteristics of the diffraction grating are determined by the period and length and the magnitude of refractive index modulation of the diffraction grating, whereby the diffraction grating can be used as a wavelength division multiplexer for optical communications, a narrow-band yet high-reflection mirror used for lasers or sensors, a wavelength selection filter for removing extra laser wavelengths in fiber amplifiers, etc.

However, the wavelength at which the attenuation of a silica optical fiber is minimized and which is suitable for long-distance communications is 1.55 μm. It is thus required that the grating spacing be about 500 nm in order to allow the optical fiber diffraction grating to be used at this wavelength. At the beginning, it was considered difficult to make such a minute structure in an optical fiber core; that is, a Bragg diffraction grating was provided in the optical fiber core by a sophisticated process comprising a number of steps, e.g., side polishing, photoresist coating, holographic exposure, and reactive ion beam etching. For this reason, much fabrication time was needed, resulting in low yields.

In recent years, however, a method of fabricating a diffraction grating by irradiating an optical fiber with ultraviolet radiation to cause a refractive index change directly in an optical fiber core has been developed. This ultraviolet irradiation method has been steadily put to practical use with the advance of peripheral technologies, because of no need of any sophisticated processes.

Since the grating spacing is as fine as about 500 nm as mentioned above, this method using ultraviolet light is now carried out by an interference process using the interference of two light beams, a writing-per-point process wherein single pulses from an excimer laser are focused to make diffraction grating surfaces one by one, an irradiation process using a phase mask having a grating, etc.

Regarding the interference process using the interference of two light beams, a problem arises in conjunction with the quality of the beams in the lateral direction, i.e., spatial coherence. A problem with the writing-per-point process is on the other hand that strict step control of the submicron order is needed to focus light on a small point for writing light on many surfaces. Another problem arises in conjunction with processability.

To solve these problems, attention has focused on the irradiation process using a phase mask. According to this process, a phase mask 21 comprising a quartz substrate provided on one surface with grooves of given depth at a given pitch is irradiated with ultraviolet laser light (of 190 to 3.00 nm wavelength) 23 to give a refractive index. change to a core 22A of an optical fiber 22, thereby producing a grating (diffraction grating)., as shown in FIG. 5(a). For a better understanding of an interference pattern 24 Qn the core 22A, the pattern 24 is exaggerated in FIG. 5(a). FIG. 5(b) is a sectional view of the phase mask 21, and FIG. 5(c) is a top view corresponding to FIG. 5(b). The phase mask 21 has a binary phase type of diffraction grating structure where a substrate is provided on one surface with grooves 26 having a depth D at a repetition pitch P, with a strip 27 substantially equal in width to each groove being provided between adjacent grooves 26.

The depth of each groove 26 on the phase mask 21 (the difference in height between strip 27 and groove 26) D is chosen such that the phase of the ultraviolet laser light (beam) that is exposure light is modulated by π radian. Thus, zero-order light (beam) 25A is reduced to 5% or less by the phase mask 21, and chief light leaving the mask 21 is divided into +first-order diffracted light 25B containing at least 35% of diffracted light and – first-order diffracted light 25C, so that the optical fiber 22 is irradiated with the +first-order diffracted light 25B and – first-order diffracted light 25C to produce an interference fringe at a given pitch, thereby providing a refractive index change at this pitch in the optical fiber 22.

The grating produced in the optical fiber using such a phase mask 21 as mentioned above has a constant pitch, and so the phase mask 21 used for grating production is provided with grooves 26 at a constant pitch.

Such a phase mask is produced by writing an electron beam on positions, corresponding to grooves 26, on the quartz substrate coated with an electron-beam resist, using an electron-beam writing system and etching out the written portions.

To achieve a narrow-band optical fiber diffraction grating, however, such a phase mask 21 as mentioned above is required to have a size of the order of 100 mm in the repetition direction of grooves 26 (in the sectional direction in FIG. 5). In addition, it is not easy to continuously expose a phase mask blank to writing beams in one operation. Thus, such an optical fiber diffraction grating is fabricated by writing the entire region of a phase mask blank with writing beams by a step-and-repeat process wherein the entire region of the phase mask blank is divided into small segments (at an interval of about 7 mm). One segment is first written with writing beams while a writing stage is fixed, and then the writing stage is moved by one segment to write the next segment with writing beams. This operation is repeated while the segments are connected to one another, so that the entire region of the phase mask blank can be sequentially written with the writing beams.

However, a problem with this step-and-repeat process is that there is a phase shift (a stitching error) in the repetition period of grooves 26 in the connection of adjacent segments to each other. In an optical fiber diffraction grating fabricated using a phase mask having such a stitching error, a number of unnecessary peaks other than essential side lobes occur on both sides of the center Bragg peak, as can be seen from the wavelength vs. reflectivity relation shown in FIG. 8.

DISCLOSURE OF THE INVENTION

In view of such problems with the prior art as mentioned above, one object of the present invention is to provide a method of fabricating an optical fiber-processing phase mask which can reduce or substantially eliminate stitching errors ascribable to a deterioration in the wavelength selectivity of the optical fiber diffraction grating to be fabricated. The present invention also includes an optical fiber with a Bragg diffraction grating, which is manufactured using such a phase mask for processing optical fibers.

According to one aspect of the present invention, this object is accomplished by the provision of a method of fabricating an optical fiber-processing phase mask comprising a transparent substrate provided on one surface with a grating form of repetitive groove-and-strip pattern, in which an optical fiber is irradiated with light diffracted by said repetitive pattern to produce an interference fringe by interference of diffracted light of different orders, thereby providing a diffraction grating in the optical fiber, wherein:

at an exposure step, a writing stage with a phase mask blank placed thereon is continuously fed in one direction while a portion of said phase mask blank corresponding to a groove or a strip perpendicular to said feeding direction is scanned with a writing beam, thereby continuously writing said beam on an entire region of said phase mask blank to be written.

According to another aspect of the present invention, there is provided a method of fabricating an optical fiber-processing phase mask comprising a transparent substrate provided on one surface with a grating form of repetitive groove-and-strip pattern, in which an optical fiber is irradiated with light diffracted by said repetitive pattern to produce an interference fringe by interference of diffracted light of different orders, thereby providing a diffraction grating in the optical fiber, wherein:

when, at an exposure step, a writing beam is written on an entire region of a phase mask blank to be written while segments smaller than said entire region to be written are sequentially scanned with said writing beam while said segments are connected to one another in a direction perpendicular to a groove or a strip, adjacent segments are allowed to overlap one another at a part of end areas thereof.

In the present invention, beam writing may be carried out using either an electron-beam writing system or a laser-light writing system.

In the present invention, the pitch of the grating form of repetitive groove-and-strip pattern is usually between 0.85 $\mu$m and 1.25 $\mu$m.

It is here noted that the difference in height between grooves and strips in the grating form of repetitive groove-and-strip pattern is preferably set such that the phase of optical fiber-processing ultraviolet radiation is shifted by approximately $\pi$ upon transmission.

The present invention also encompasses an optical fiber provided with a Bragg diffraction grating, which is produced using the optical fiber-processing phase mask fabricated by either one of the above two fabrication methods.

According to the present invention, the writing stage with the phase mask blank placed thereon is continuously fed in one direction at the exposure step while a portion of the phase mask blank corresponding to a groove or a strip perpendicular to the feeding direction is scanned with a writing beam, thereby continuously writing the entire region of the phase mask blank to be written. Alternatively, when, at the exposure step, a writing beam is written on the entire region of a phase mask blank to be written while segments smaller than said entire region to be written are sequentially scanned with said writing beam while said segments are connected to one another in a direction perpendicular to a groove or a strip, adjacent segments are allowed to overlap one another at a part of end areas thereof. Thus, there is no stitching error due to connections between the segments to be written, unlike the prior art. In the optical fiber provided with a Bragg diffraction grating which is produced using such a phase mask, no unnecessary peaks occur on both sides of the center Bragg peak.

BEST MODE OF CARRYING OUT THE INVENTION

The method of fabricating an optical fiber-processing phase mask according to the present invention will now be explained with reference to some preferred embodiments.

Figure 2:
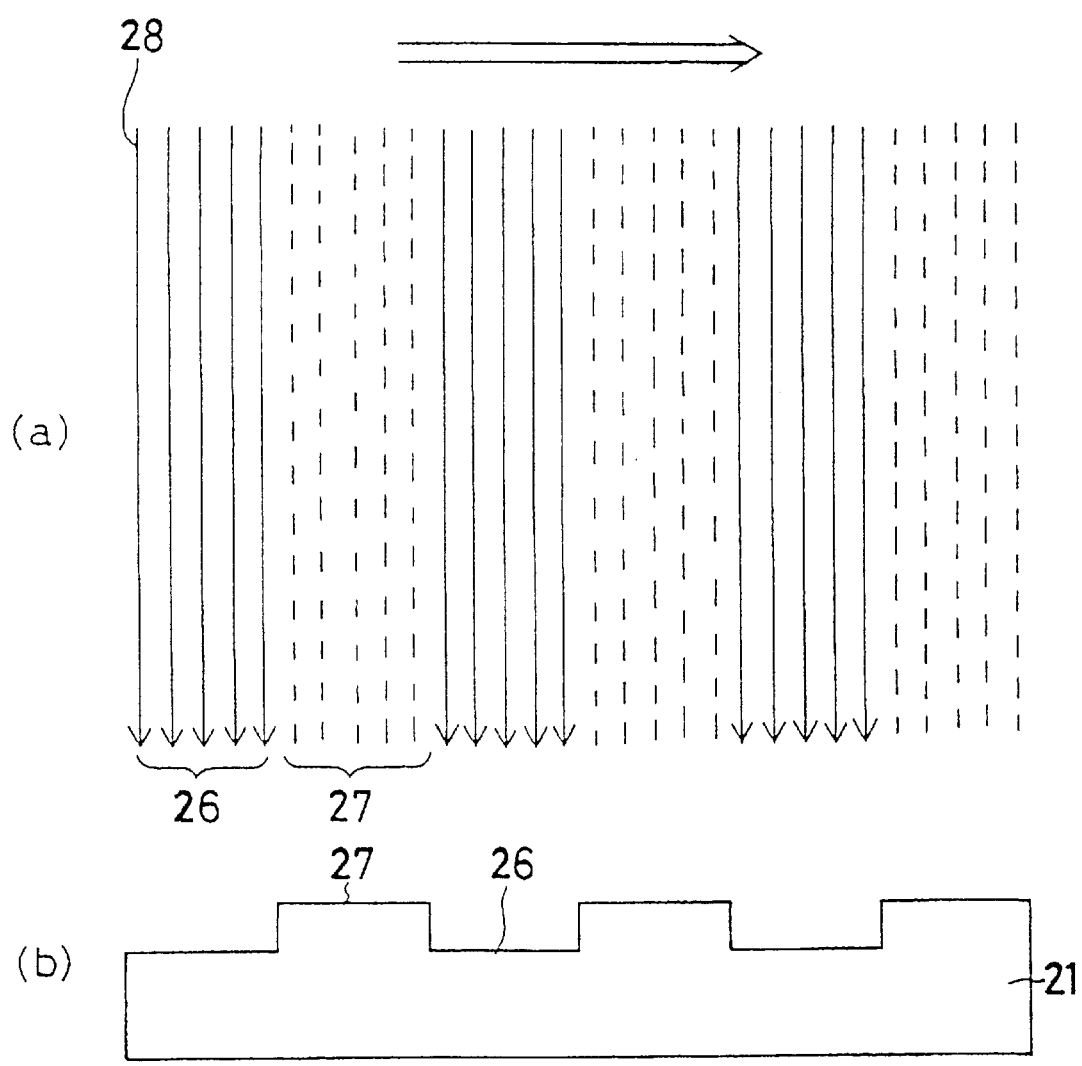
FIG. 2(a) is illustrative of an electron-beam writing process used with the method of fabricating a phase mask.
FIG. 2(b) is a sectional view of the phase mask.
Figure 4:
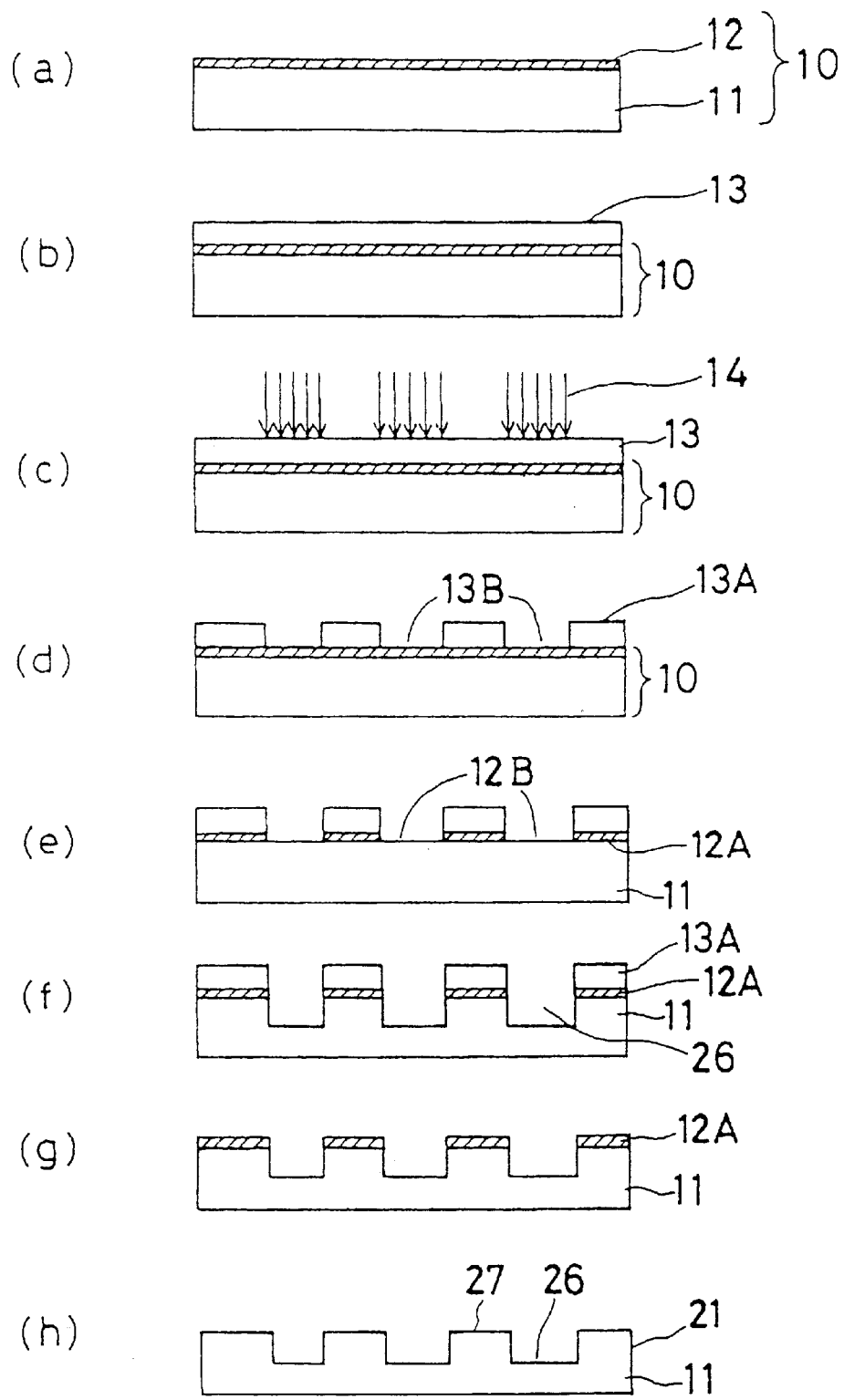
FIGS. 4(a), 4(b), 4(c), 4(d), 4(e), 4(f), 4(g) and 4(h) are sectional views of steps in one embodiment of the chase mask fabrication method according to the invention.
Figure 5:
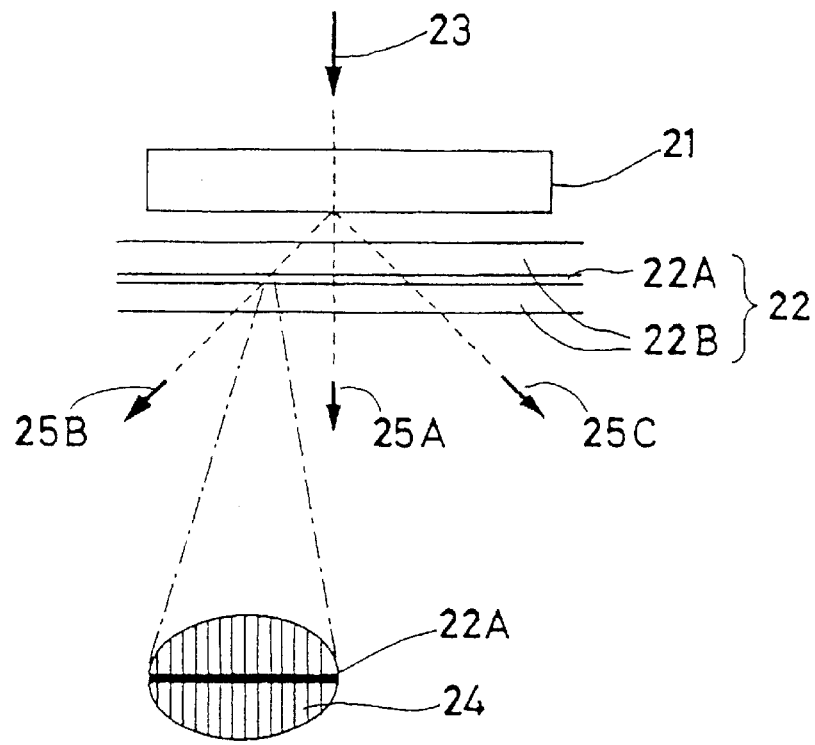
FIGS. 5(a), 5(b) and 5(c) are views illustrative of optical fiber processing and a phase mask used therewith.
Figure 5:
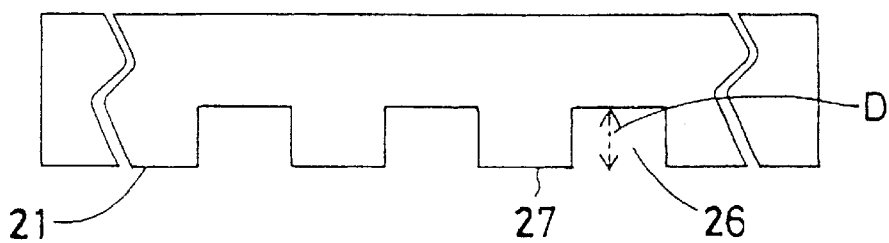
Figure 5:
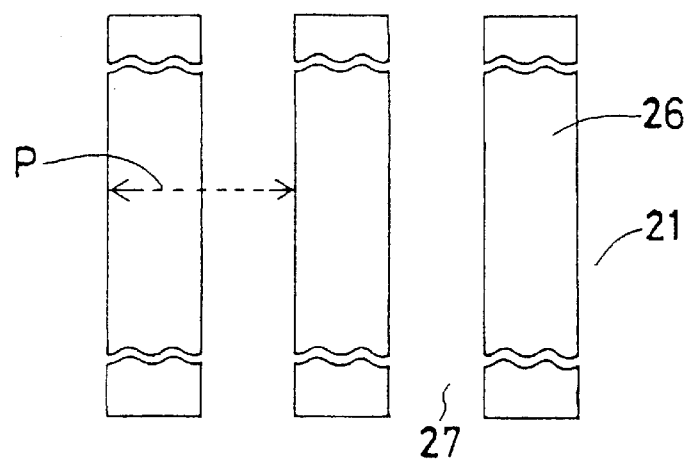

FIG. 2(b) is a sectional view of a part of a phase mask 21 in its longitudinal direction. This phase mask 21 comprising a repetitive alternate groove-and-strip pattern is located as shown in FIG. 5(a) for the purpose of fabricating a Bragg diffraction grating in an optical fiber. The groove is shown at 26, and the strip is shown at 27. As shown in the FIG. 2(a) top view, one groove 26 is formed on a quartz substrate with an electron-beam resist coated thereon (see FIG. 4) by raster scan of the substrate with electron-beam scanning lines 28 in the widthwise direction. As shown by broken lines, one strip 27 is formed on the substrate by blanking the electron-beam scan. According to the present invention, the whole of the continuous mask 21 is exposed to electron beams as follows. Raster scan is carried out in a direction shown by a double-arrow in FIG. 2(a) (in a direction vertical to groove 26 and strip 27). As mentioned above, the position of the substrate on which one groove 26 is to be written is actually scanned with a given number of scanning lines (five lines in FIG. 2(a)), and at the position of the substrate on which the next strip 27 is to be written as many as scanning lines are blanked. This is repeated sequentially over and over again, so that the phase mask 21 having a given length can be exposed to electron beams in one operation.

Figure 1:
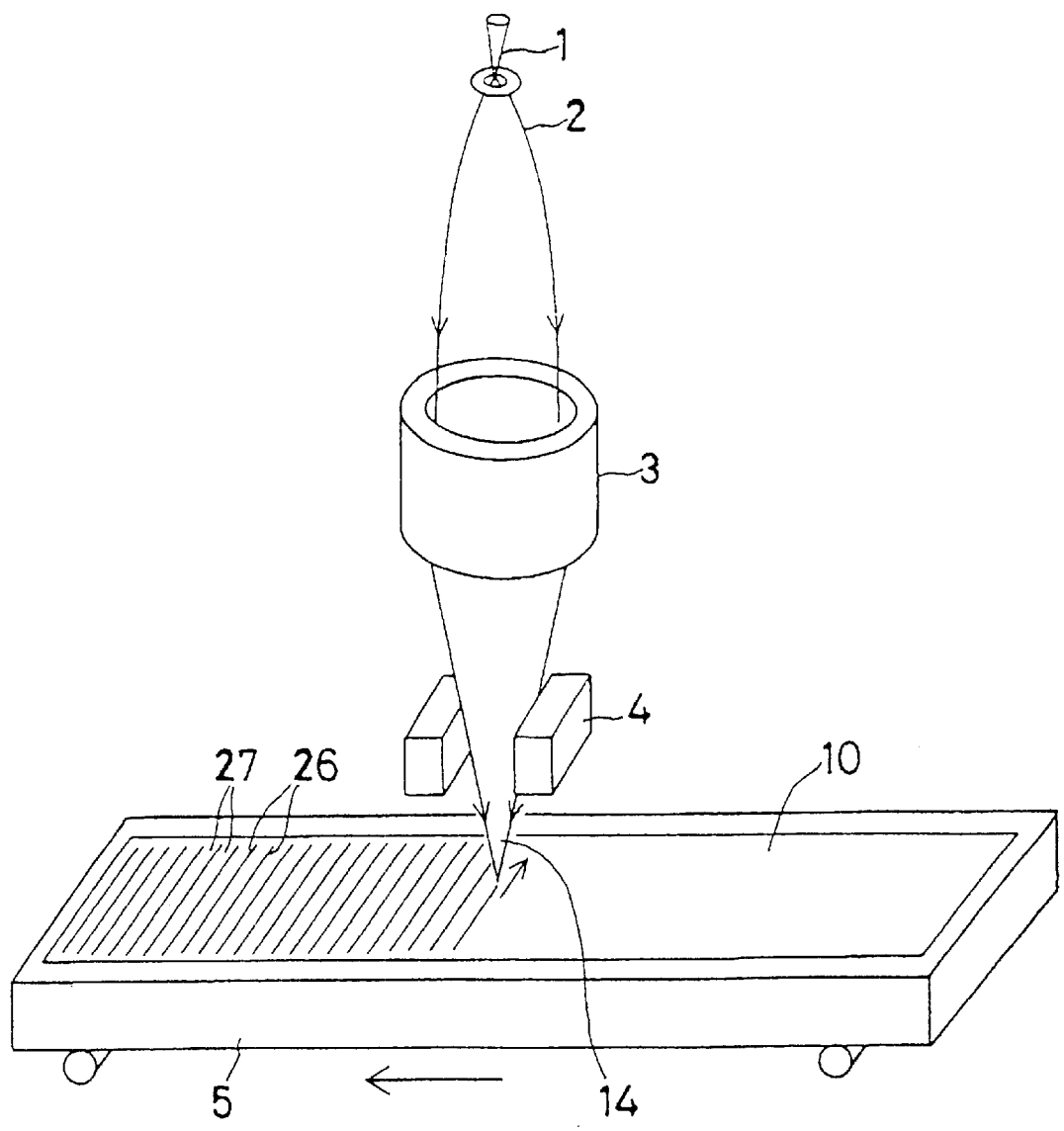
FIG. 1 is a schematic illustrative of how the fabrication method of the invention is carried out using an electron-beam writing system.

In the present invention, an electron-beam writing system is used, which is built up of an electron gun 1, an electronic lens 2 for converging electron beams 2 radiated from the electron gun 1, an electronic deflector 4 for deflecting the converged electron beams 14, and a writing stage 5 movable in a direction (Y-direction) perpendicular to one direction (X-direction) of scanning of the converged electron beams 14 deflected by the electronic deflector 4, as schematically shown in FIG. 1. On the writing stage 5 there is placed a phase mask blank 10 comprising a quartz substrate coated thereon with an electron-beam resist. While the writing stage 5 is carried at a constant speed in the direction (Y-direction) perpendicular to the direction of scanning, the phase mask blank 10 is scanned with the converged electron beams 14 at a given repetition interval in the direction of scanning (X-direction) to write grooves 26 thereon with the electron beams.

Figure 8:
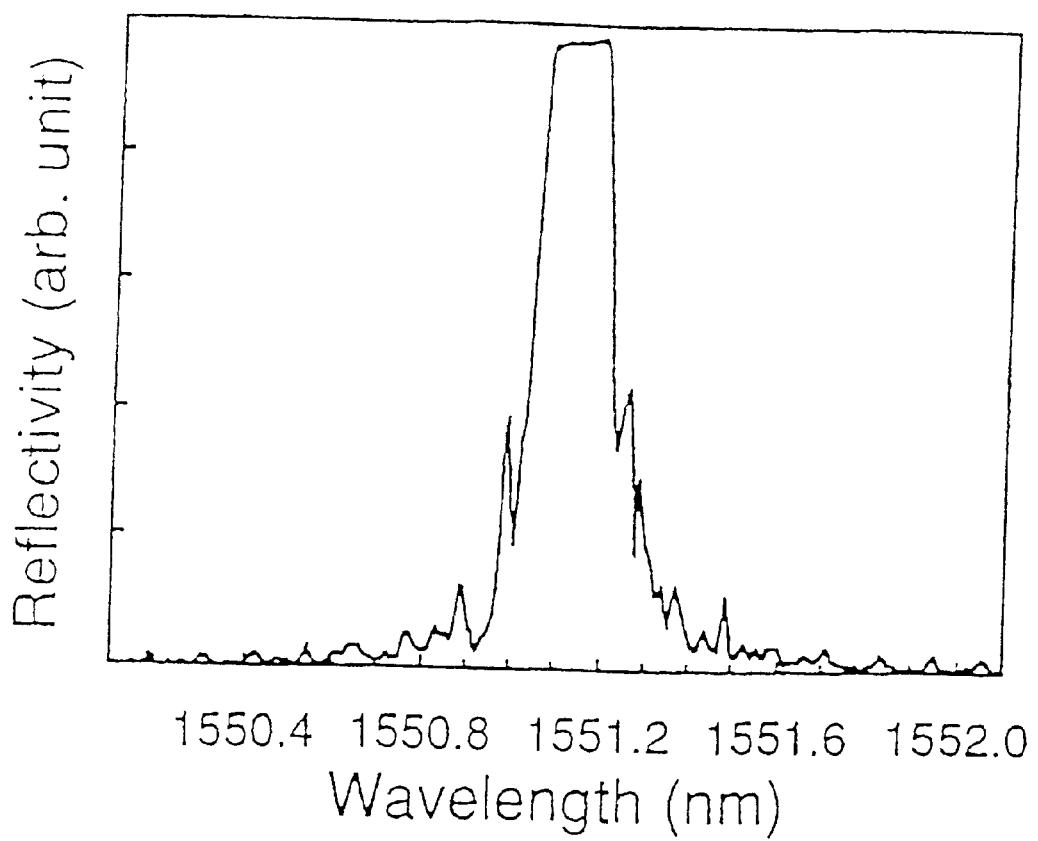
FIG. 8 is a graph illustrative of one wavelength vs. reflectivity relation of an optical fiber with a Bragg diffraction grating, which is fabricated by a conventional step-and-repeat process.

In the present invention as mentioned above, the phase mask blank is placed on the writing stage at the exposure step of the lithographic process of fabricating an optical fiber-processing phase mask. Then, while the writing stage is continuously fed in one direction, portions of the phase mask blank corresponding to grooves or strips perpendicular to the feeding direction of the writing stage are sequentially scanned with writing beams, so that the entire area of the phase mask blank to be written can be continuously written. Unlike the prior art, there is thus no stitching error due to connections between the written segments. Accordingly, such unnecessary peaks (noises) as shown in FIG. 8 are not found in an optical fiber diffraction grating fabricated using this phase mask.

Figure 3:
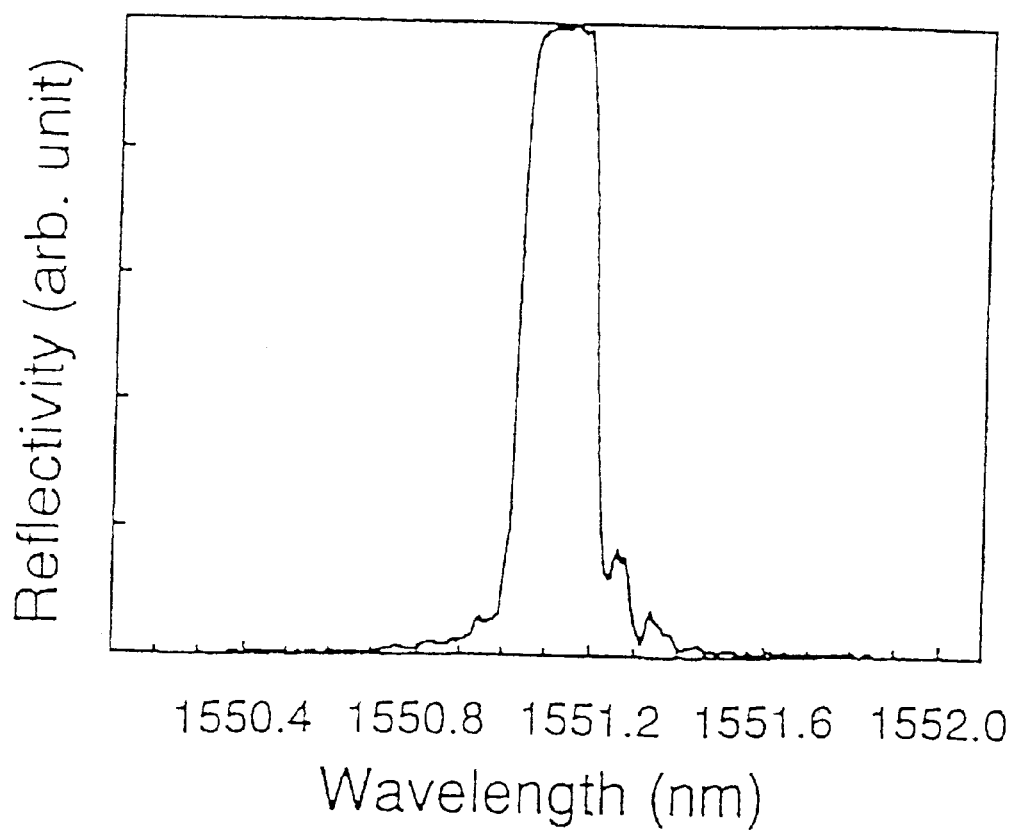
FIG. 3 is a graph showing one wavelength vs. reflectivity relation of the optical fiber provided with a Bragg diffraction grating, which is produced using the phase mask of the invention.

The first aspect of the invention is explained with reference to one specific example. A silica optical fiber with photosensitivity enhanced by the filling of high-pressure hydrogen was used as the photosensitive optical fiber 22, and continuously exposed to light by the aforesaid process. On the other hand, a phase mask 21 of 100 mm in length was fabricated through the following steps. Then, the modulation of refractive index was imparted directly to a core 22A of the optical fiber 22, as shown in FIG. 5(a). In this case, an argon SHG laser (of 244 nm wavelength) was used as the ultraviolet laser light source. The wavelength vs. reflectivity relation of the thus fabricated optical fiber provided with a Bragg diffraction grating is shown in FIG. 3. From a comparison with FIG. 8, it is seen that unnecessary peaks are not substantially found on both sides of the center Bragg peak.

FIG. 4(a) to FIG. 4(h) are sectional views of the process of fabricating the aforesaid phase mask 21. In these figures, reference numeral 10 represents a phase mask blank, 11 a quartz substrate, 12 a chromium thin film, 12A a chromium thin-film pattern, 12B an opening in the chromium thin film, 13 an electron-beam resist, 13A a resist pattern, 13B a resist opening, 14 converged scanning electron beams in the FIG. 1 system, 21 a phase mask, 26 a groove, and 27 a strip.

As shown in FIG. 4(a), the blank 10 was first prepared by forming the chromium thin film 12 of 150 Å in thickness on the quartz substrate 11. The chromium thin film 12 is useful for preventing a charging-up of the electron-beam resist 13 at the electron-beam (14) irradiation step, and serves as a mask in the formation of the groove 26 on the quartz substrate. The thickness of this chromium thin film is important in view of resolution in chromium thin-film etching, and so should preferably be controlled to 100 to 200 Å.

Then, electron-beam resist RE5100P (made by Hitachi Kasei Co., Ltd.) as the electron-beam resist 13 was coated on the chromium thin film 12 to a thickness of 400 nm, and dried, as shown in FIG. 4(b).

After this, the electron-beam resist 13 was exposed to light at an exposure of 1.2 $\mu$C/cm$^2$, as shown in FIG. 4(c), using an electron-beam writing system MEBESIII (made by ETEC). That is, as explained with reference to FIGS. 1 and 2, one groove 26 was written with five raster scanning lines. While the writing stage 5 was fed in one direction, the portions of the phase mask blank 10 corresponding to grooves 26 perpendicular to the direction of feeding are sequentially scanned with the electron beams 14 for exposure to the writing light of the entire area of the phase mask blank 10 to be written.

After the exposure, post-exposure baking was carried out at 90° C. for 5 minutes, and the electron-beam resist 13 was developed with TMAH (tetramethylammonium hydroxide) at a concentration of 2.38%, thereby forming such desired resist pattern 13A as shown in FIG. 4(d). It is here noted that the post-exposure baking is to selectively enhance the sensitivity of the portion irradiated with the electron beams 14.

Then dry etching was performed with $CH_2Cl_2$ gas while the resist pattern 13A was used as a mask, thereby forming such chromium thin-film pattern 12A as shown in FIG. 4(e).

Subsequently, the quartz substrate 11 was etched with $CF_4$ gas to a depth of just 240 nm, while the chromium thin-film pattern 12A was used as a mask, as shown FIG. 4(f). Depth control was conducted by etching time control. Etching can occur while the etching depth is controlled in the range of 200 to 400 nm.

Following this, the resist pattern 13A was stripped off with sulfuric acid at 70° C., as shown in FIG. 4(g). Finally, the chromium thin-film pattern 12A was etched out with an ammonium ceric nitrate solution, as shown in FIG. 4(h), and scrubbing was carried out to obtain a complete line-and-space phase mask 21 having a depth of 240 nm and a pitch of 1.070 $\mu$m, wherein the lines and spaces corresponded to strips 27 and grooves 26, respectively.

The above example is given to explain the lithographic process of fabricating the phase mask 21 wherein while the writing stage with a phase mask blank placed thereon is fed in one direction, the entire area of the phase mask blank to be written is sequentially scanned and written with writing beams. The present invention is also applicable to a step-and-repeat writing process wherein the entire area of a phase mask blank to be written is divided into small segments. First, one segment is written while a writing stage is fixed in place:. Then, the writing stage is moved by one segment so that the next segment is written. This operation is repeated to sequentially write the segments with writing beams while adjacent: segments are connected to each other. If, in this process, the movement of the writing stage is limited to smaller than one segment to stitch one segment to another during exposure, it is then possible to reduce stitching errors. This process is explained below.

Figure 6:
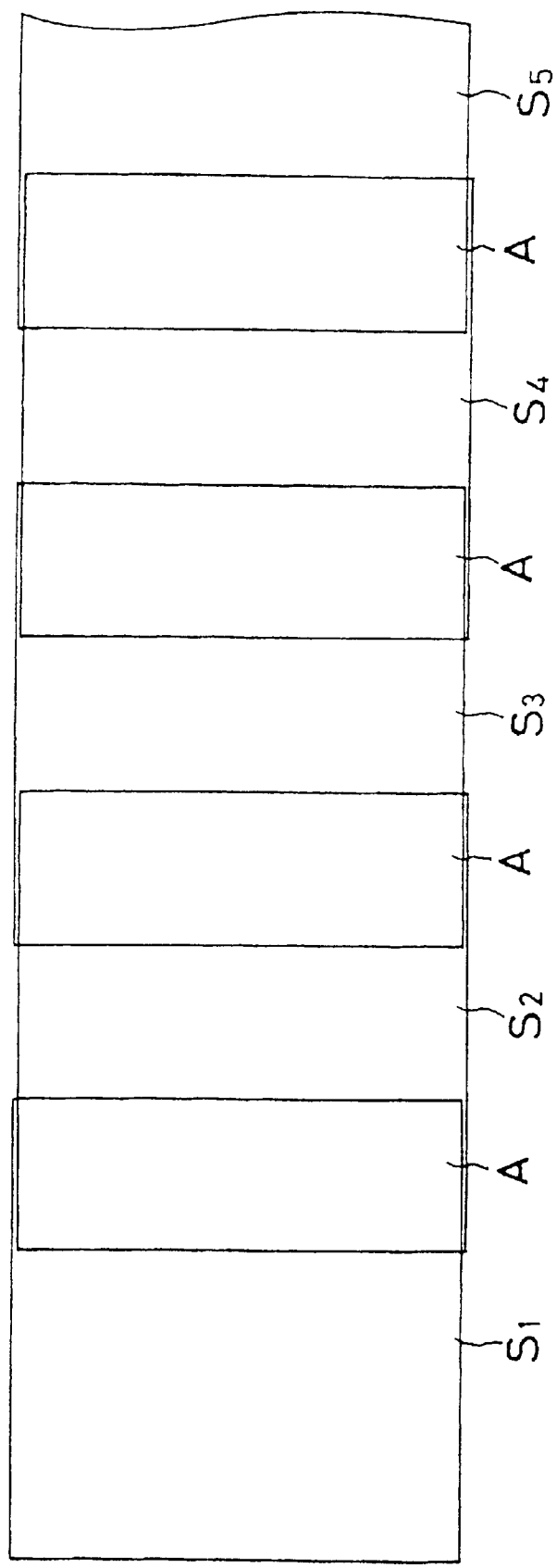
FIG. 6 is a schematic illustrative of another writing process according to the invention.
Figure 7:
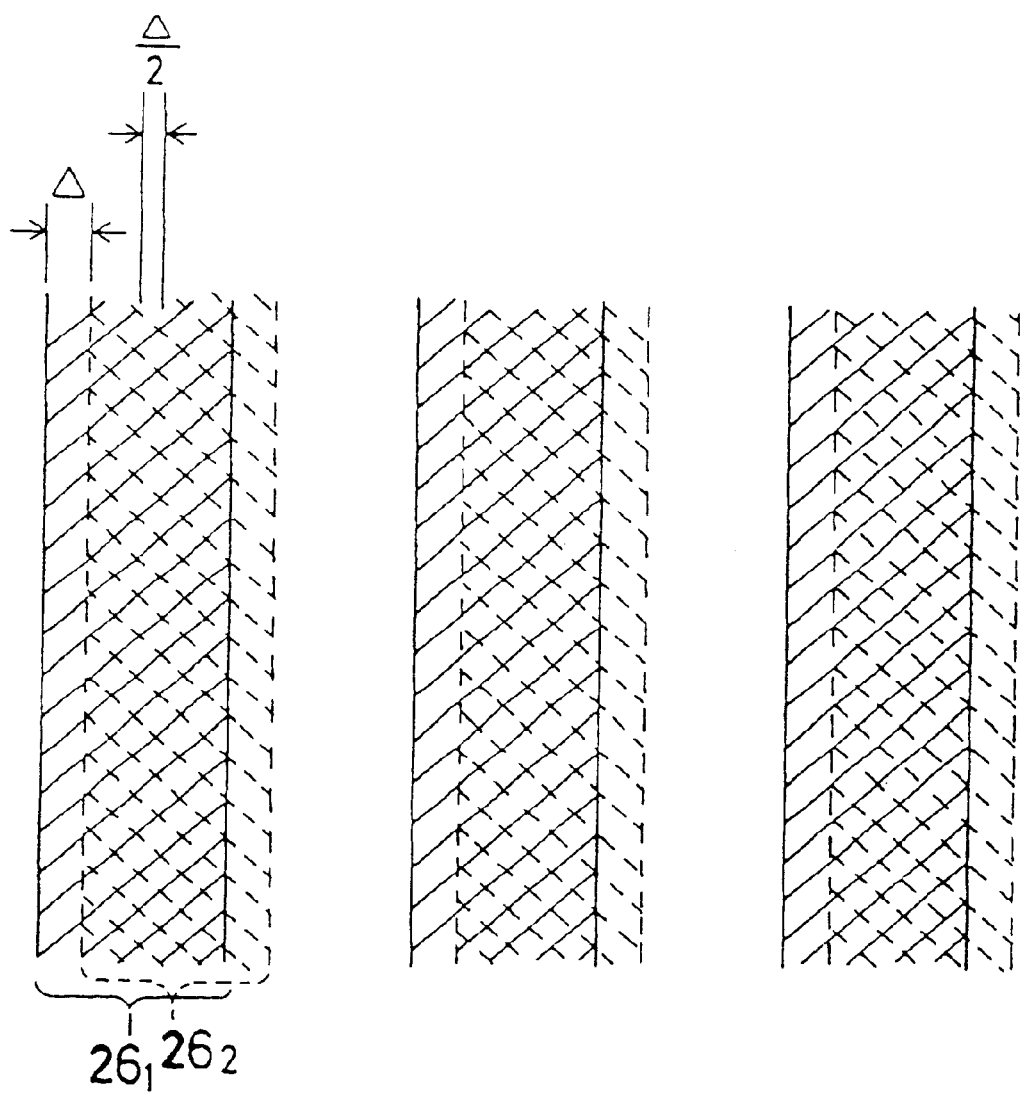
FIG. 7 is an exaggerated view of a part of the overlapping region in FIG. 6.

FIG. 6 is a schematic view of segments $S_1$ to $S_5$ to be written. The segments $S_1$ to $S_5$ are connected to one another while they are sequentially written by the step-and-repeat process. In-this case, the adjacent segments are written while they overlap at an end region A. FIG. 7 is an exaggerated view of the overlapping region A. In FIG. 7, reference numeral $26_1$ represents a portion of one of the adjacent segment exposed to writing light to form a groove therein (solid lines), and $26_2$ stands for a portion of another segment exposed to writing light to form a groove therein (broken lines). Here assume that $\Delta$ represents a displacement between the adjacent segment. Then, one groove defines an overlap of the exposed portions $26_1$ and $26_2$, and the center thereof displaces by $\Delta/2$ from the center of a groove in the case where the adjacent segments do not overlap. That is, this displacement corresponds to a half of the position displacement between the adjacent segments. For this reason, the stitching error reduces to half. When the adjacent segments. overlap three times, the stitching error reduces to ⅓. It is desired that the process of connecting segments to one another using the overlapping region A be applied to the case where segments are connected to one another not only in a direction perpendicular to the groove but also in a direction along the groove. It is here to be noted that when segments are written with electron beams while they overlap, the exposure intensity of the electron beams used for writing the overlapping region should preferably be reduced depending on the number of overlapping, so that the exposure quantity of the overlapping region can be much the same as that of a region which is exposed once to electron beams.

While the method of fabricating an optical fiber-processing phase mask according to the invention and the optical fiber with a Bragg diffraction grating, which is manufactured using this optical fiber-processing phase mask, are explained with reference to preferred embodiments, it is understood that the invention is not limited to these embodiments, and so may be modified in various forms. While the present invention is explained with reference to the use of raster scan type electron-beam writing system, it is understood that the invention may also be carried out using a vector scan type writing system or the like. In the invention, a laser-light writing system may be used in place of the electron-beam writing system.

Industrial Applicability

In the method of fabricating an optical fiber-processing phase mask according to the invention as explained above, the writing stage with the phase mask blank placed thereon is continuously fed in one direction at the exposure step while portions of the phase mask blank corresponding to grooves or strips perpendicular to the direction of feeding are sequentially scanned with writing beams, thereby continuously writing the entire region of the phase mask blank to be written with the writing beams. Alternatively, when, at the exposure step, the entire region of the phase mask blank to be written are written with writing beams while segments smaller than the entire region of the phase mask blank are sequentially scanned with the writing beams and the segments are connected to one another in a direction perpendicular to grooves or strips, adjacent segments are allowed to overlap one another at a part of end areas thereof. Thus, there is no stitching error due to connections between the segments to be written, unlike the prior art. In the optical fiber provided with a Bragg diffraction grating which is produced using such a phase mask, no unnecessary peaks occur on both sides of the center Bragg peak.

What we claim is:

1. A method of fabricating an optical fiber-processing phase mask comprising a transparent substrate provided on one surface with a grating form of repetitive groove-and-strip pattern, in which an optical fiber is irradiated with light diffracted by said repetitive pattern to produce an interference fringe by interference of diffracted light of different orders, thereby providing a diffraction grating in the optical fiber, wherein:

at an exposure step, a writing stage with a phase mask blank placed thereon is continuously fed at a constant speed in one direction while portions of said phase mask blank corresponding to ones of plural grooves or strips perpendicular to said feeding direction are scanned with plural writing beams, thereby continuously writing said beams on an entire region of said phase mask blank to be written.

2. The method according to claim 1, wherein writing is carried out using an electron-beam writing system.

3. The method according to any one of claim 1 or 2, wherein said grating form of repetitive groove-and-strip pattern has a pitch between 0.85 $\mu$m and 1.25 $\mu$m.

4. The method according to any one of claim 1 or 2, wherein a difference in height between grooves and strips in said grating form of repetitive groove-and-strip pattern is set such that a phase of optical fiber-processing ultraviolet radiation is shifted by approximately $\pi$ upon transmission.

5. An optical fiber provided with a Bragg diffraction grating, which is produced using the optical fiber-processing phase mask fabricated by the method according to any one of claim 1 or 2.

6. The method according to claim 3, wherein a difference in height between grooves and strips in said grating form of repetitive groove-and-strip pattern is set such that a phase of optical fiber-processing ultraviolet radiation is shifted by approximately $\pi$ upon transmission.

7. An optical fiber provided with a Bragg diffraction gratings, which is produced using the optical fiber-processing phase mask fabricated by the method according to claim 3.

8. An optical fiber provided with a Bragg diffraction grating, which is produced using the optical fiber-processing phase mask fabricated by the method according to claim 4.

9. An optical fiber provided with a Bragg diffraction grating, which is produced using the optical fiber-processing phase mask fabricated by the method according to claim 6.

10. The method of fabricating an optical fiber-processing phase mask according to claim 1, wherein the number of said plural writing beams is at least five.

* * * * *